(12) United States Patent
Liu et al.

(10) Patent No.: US 11,815,382 B2
(45) Date of Patent: Nov. 14, 2023

(54) FLOW METER

(71) Applicant: Spire Metering Technology LLC, Marlborough, MA (US)

(72) Inventors: Tianshui Liu, Canton, MA (US); Chang Shen, Belmont, MA (US); Murad Laribi, Chelsea, MA (US)

(73) Assignee: SPIRE METERING TECHNOLOGY LLC, Marlborough, MA (US)

( * ) Notice: Subject to any disclaimer, the term of this patent is extended or adjusted under 35 U.S.C. 154(b) by 304 days.

(21) Appl. No.: 17/146,876

(22) Filed: Jan. 12, 2021

(65) Prior Publication Data

US 2021/0223077 A1 Jul. 22, 2021

Related U.S. Application Data

(60) Provisional application No. 62/961,916, filed on Jan. 16, 2020.

(51) Int. Cl.
*G01F 1/66* (2022.01)
*H05K 1/18* (2006.01)
(Continued)

(52) U.S. Cl.
CPC .............. *G01F 1/662* (2013.01); *G01F 15/06* (2013.01); *G01K 13/02* (2013.01); *H05K 1/181* (2013.01);
(Continued)

(58) Field of Classification Search
CPC ......... G01F 1/662; G01F 15/06; G01K 13/02; H05K 1/181; H05K 2201/10098; H05K 2201/10128
(Continued)

(56) References Cited

U.S. PATENT DOCUMENTS

| | | | |
|---|---|---|---|
| 2012/0006127 A1* | 1/2012 | Nielsen ..................... | G01F 1/66 73/861.27 |
| 2013/0139610 A1* | 6/2013 | Laursen .................. | G01F 15/14 73/861.18 |

(Continued)

FOREIGN PATENT DOCUMENTS

WO    WO-2015134715 A2 *    9/2015    ............. G01L 13/06

*Primary Examiner* — Nathaniel T Woodward
(74) *Attorney, Agent, or Firm* — KRIEGSMAN & KRIEGSMAN

(57) ABSTRACT

A flow meter for measuring the flow rate or volume of a fluid includes a flow tube shaped to define an internal passageway through which the fluid travels, a set of transducers coupled to the flow tube in fluid communication with the internal passageway, and a core module coupled to the flow tube. The core module comprises a cup-shaped enclosure shaped to define an interior cavity and a top cover mounted on the enclosure to enclose the interior cavity. A disc-shaped partition separates the interior cavity into an upper compartment which receives a printed circuit board assembly and a lower compartment which receives a power supply assembly and a connector assembly. Separating the interior cavity into distinct compartments allows for different waterproofing techniques to be utilized based on the sensitivity and lifespan differential between the various electrical components, thereby minimizing the use of potting material and facilitating component replacement.

8 Claims, 10 Drawing Sheets

(51) Int. Cl.
*G01F 15/06* (2022.01)
*G01K 13/02* (2021.01)

(52) U.S. Cl.
CPC .............. *H05K 2201/10098* (2013.01); *H05K 2201/10128* (2013.01)

(58) Field of Classification Search
USPC ...................................................... 73/861.18
See application file for complete search history.

(56) References Cited

U.S. PATENT DOCUMENTS

| | | | |
|---|---|---|---|
| 2015/0219482 A1* | 8/2015 | Drachmann | G01F 1/662 |
| | | | 29/854 |
| 2019/0113376 A1* | 4/2019 | Skallebæk | G01F 15/005 |
| 2019/0226893 A1* | 7/2019 | Kuhlemann | G01F 1/662 |

* cited by examiner

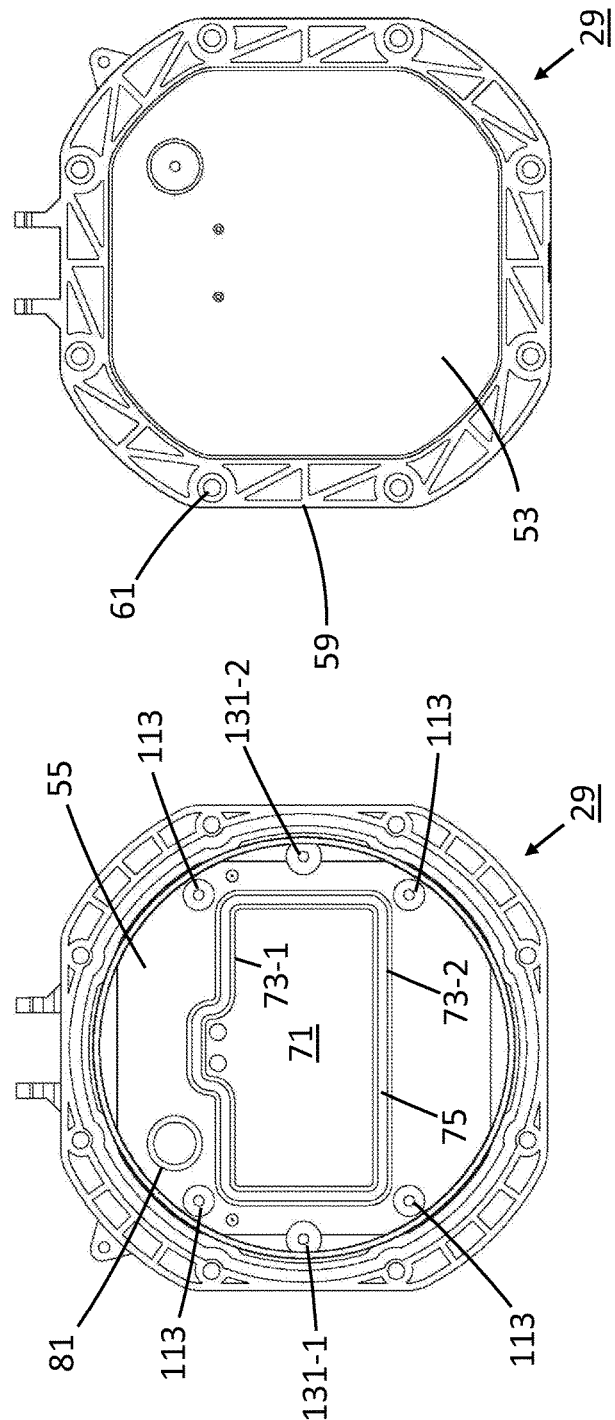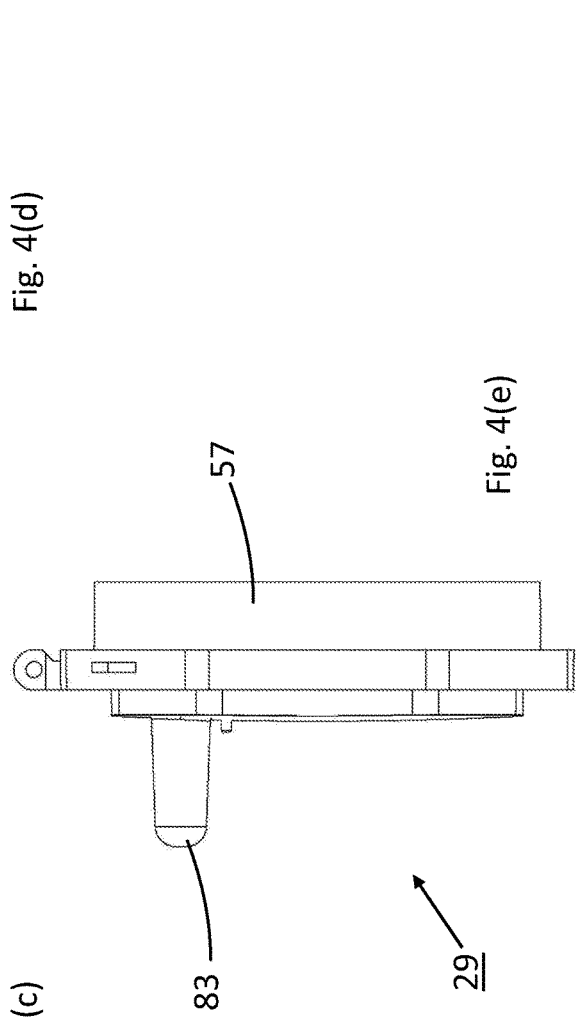

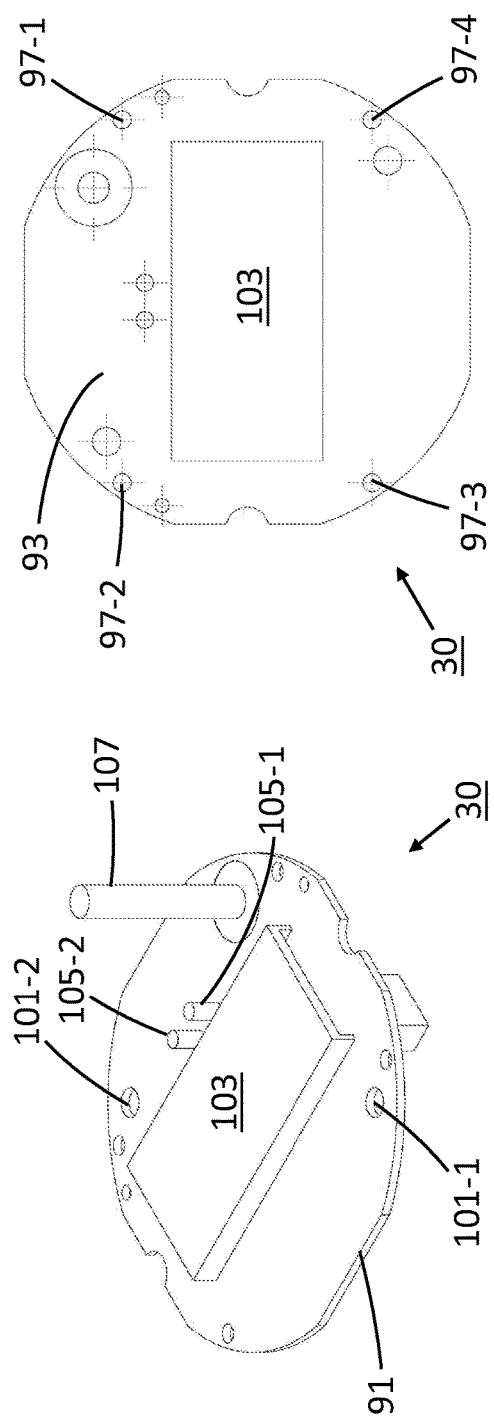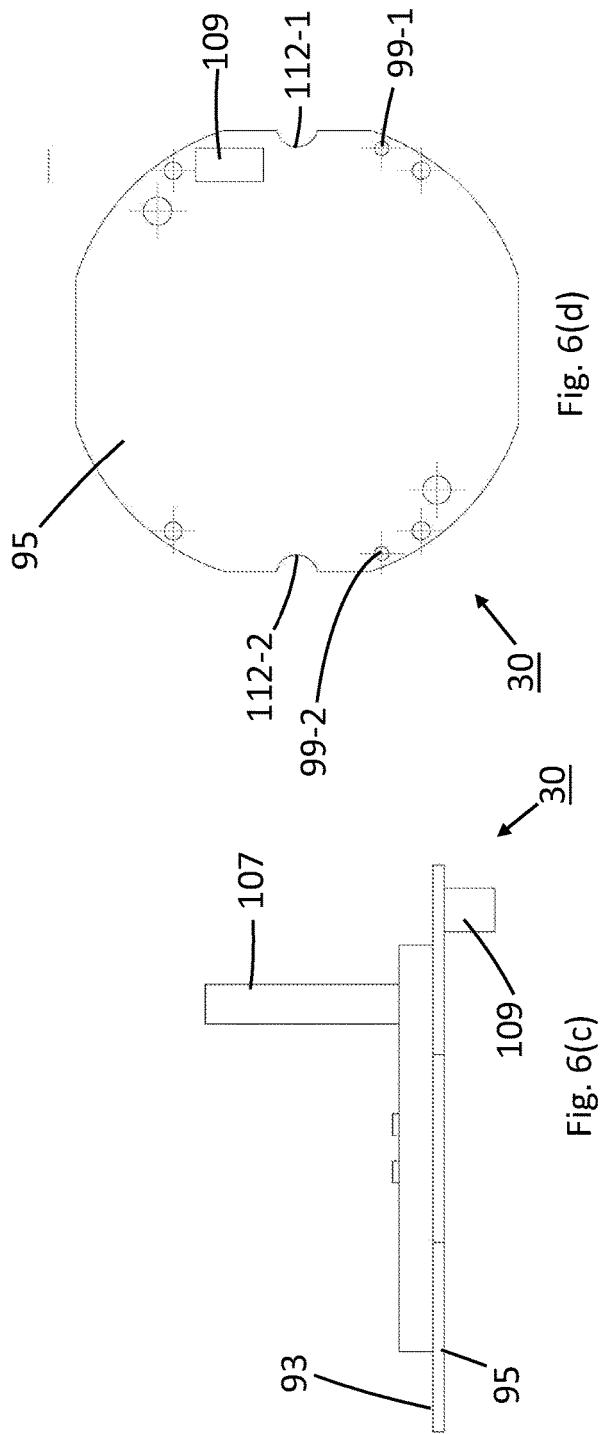

FLOW METER

CROSS-REFERENCE TO RELATED APPLICATIONS

The present application claims the benefit under 35 U.S.C. 119(e) to U.S. Provisional Patent Application No. 62/961,916, which was filed on Jan. 16, 2020 in the names of Tianshui Liu et al., the disclosure of which is incorporated herein by reference.

FIELD OF THE INVENTION

The present invention relates generally to fluid measurement devices and, more particularly, to flow meters.

BACKGROUND OF THE INVENTION

A flow meter is a fluid measurement device that measures the velocity of fluid traveling through a designated conduit. In this manner, a flow meter can determine the total volume of fluid used over a period of time in a particular environment. For this reason, flow meters are commonly utilized in both public and private water systems to measure water consumption.

One type of flow meter which is well known in the art comprises (i) a flow cell, or tube, which defines the interior channel through which the designated fluid travels, (ii) a combination of transducers and sensors disposed in fluid communication with the interior channel that, among other things, transmit and receive ultrasonic waves within the designated conduit, and (iii) a core, or integrator, module mounted on the flow tube in electrical connection with the plurality of sensors for compiling and processing signal data provided by the sensors (e.g. the rate of wave propagation between sensor pairs) in order accurately calculate fluid flow rate and/or volume.

The core module is typically constructed as a unitary component that is mounted onto the flow cell through a watertight seal (e.g. by gasket). The core module commonly comprises (i) an enlarged, cup-shaped enclosure, or housing, shaped to define an interior cavity, (ii) a printed circuit board (PCB) assembly for processing signal data to yield flow rate measurement results, wirelessly transmitting the results via an antenna, and visually presenting the measurements via a display, (iii) a power source electrically connected to the PCB assembly, and (iv) a top cover mounted onto the open top end of the enclosure through a watertight seal, the top cover being at least partially light transmissive to allow for visualization of measurements provided by the display.

As referenced above, the core module is assembled using watertight seals to prevent the introduction of moisture into the enclosure and, in turn, into contact with the various water-sensitive electrical components retained therein, such as the PCB, antenna, display, and power source. Nonetheless, because the core module is often disposed in a damp environment and the watertight seals inherently suffer from certain imperfections, moisture often enters into the enclosure.

Therefore, in order to protect the sensitive electrical components in the module from moisture, voids within the enclosure are commonly filled with a potting material (e.g., an epoxy potting compound). In this manner, the various electrical components contained within the module are encapsulated within the potting material and thereby protected from moisture.

Although well-known and widely used in the art, the aforementioned technique of encapsulating the core module electronics in a potting material introduces a number of notable shortcomings.

As a first shortcoming, the aforementioned technique is almost entirely reliant upon potting material to protect potentially-sensitive electronics from moisture. However, it has been found that potting material is prone to deformation or wearing away over time, particularly if exposed to moisture. If the potting material becomes worn, internal electronics would be susceptible to exposure to moisture, thereby compromising the overall functionality of the meter.

As a second shortcoming, the aforementioned technique renders power source replacement problematic. Specifically, as noted above, the power source (e.g. a battery) is typically disposed within the interior of the enclosure and encapsulated within potting material. However, over time, battery replacement is often necessary, which is relatively difficult because a large quantity of potting material is typically utilized to encapsulate the battery and the other electronic components. Accordingly, to replace the battery, a significant amount of potting material must first be removed from the enclosure in order to disconnect and remove the battery. Thereafter, a replacement battery is inserted into the enclosure and coupled to the appropriate electrical connector. Finally, a new supply of potting material is deposited into the enclosure to protect any exposed electrical components. As can be appreciated, the above-described method of battery replacement is labor-intensive and time-consuming.

As a third shortcoming, the aforementioned technique renders the core module relatively difficult to assemble. Notably, it has been found to be difficult to fill potting material between the numerous components retained within the integrator module, particularly due to the unique geometries associated with the various parts. Furthermore, the process of coupling the various electrical connectors used to complete the circuitry for the module electronics is complicated due to the presence of the potting material. In fact, potting material often unintentionally encapsulates electrical connectors, rendering coupling difficult.

SUMMARY OF THE INVENTION

In view thereof, it is an object of the present invention to provide a novel flow meter for measuring the flow rate and/or volume of fluid delivered therethrough.

It is another object of the present invention to provide a flow meter of the type as described above which has a watertight construction and effectively protects potentially-sensitive electronics from moisture.

It is yet another object of the present invention to provide a flow meter of the type as described above which readily allows for the replacement of the internally-housed power source.

It is still another object of the present invention to provide a flow meter of the type as described above which is inexpensive to manufacture, is easy to assemble and maintain, and is simple to use.

Accordingly, as one feature of the present invention, there is provided a flow meter, comprising (a) a flow tube shaped to define an internal passageway, (b) a set of transducers coupled to the flow tube in fluid communication with the internal passageway, and (c) a core module coupled to the flow tube, the core module comprising (i) an enclosure shaped to define an interior cavity, (ii) a partition mounted within the interior cavity of the enclosure, the partition separating the interior cavity into an upper compartment and a lower compartment, (iii) a printed circuit board (PCB) assembly in electrical communication with the set of transducers, the PCB assembly being mounted in the enclosure within the upper compartment of the interior cavity, and (iv) a power supply assembly in electrical communication with the PCB assembly and the set of transducers, the power supply assembly being mounted in the enclosure within the lower compartment of the interior cavity.

Various other features and advantages will appear from the description to follow. In the description, reference is made to the accompanying drawings which form a part thereof, and in which is shown by way of illustration, an embodiment for practicing the invention. The embodiment will be described in sufficient detail to enable those skilled in the art to practice the invention, and it is to be understood that other embodiments may be utilized and that structural changes may be made without departing from the scope of the invention. The following detailed description is therefore, not to be taken in a limiting sense, and the scope of the present invention is best defined by the appended claims.

BRIEF DESCRIPTION OF THE DRAWINGS

In the drawings, wherein like reference numerals represent like parts:

FIGS. 4(a)-(e) are bottom perspective, top perspective, bottom, top, and right end views, respectively, of the top cover shown in FIG. 2;

FIGS. 6(a)-(d) are top perspective, top, front, and bottom, views, respectively, of the printed circuit board assembly shown in FIG. 2;

DETAILED DESCRIPTION OF THE INVENTION

Flow Meter 11

Figure 1A:
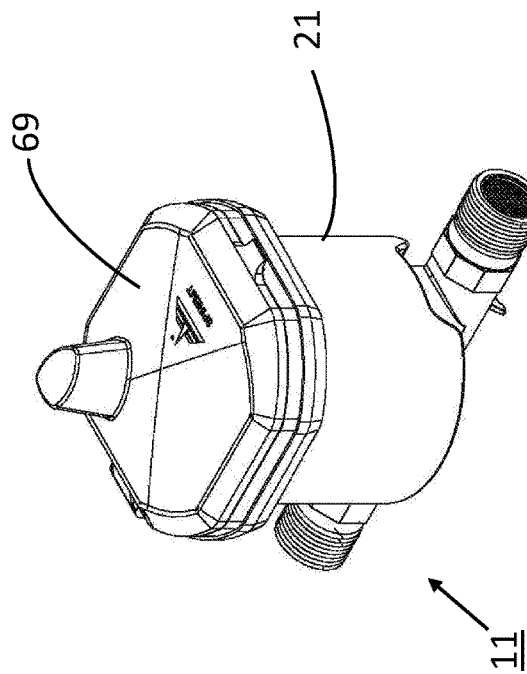
FIGS. 1(a)-(d) are front perspective, top, front, and right end views, respectively, of a flow meter constructed according to the teachings of the present invention.
Figure 1D:
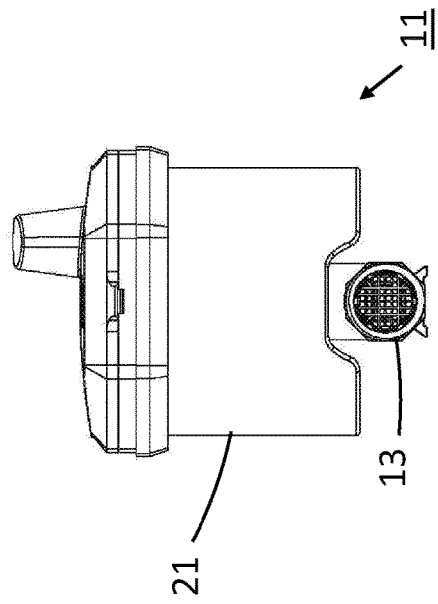
Figure 1B:
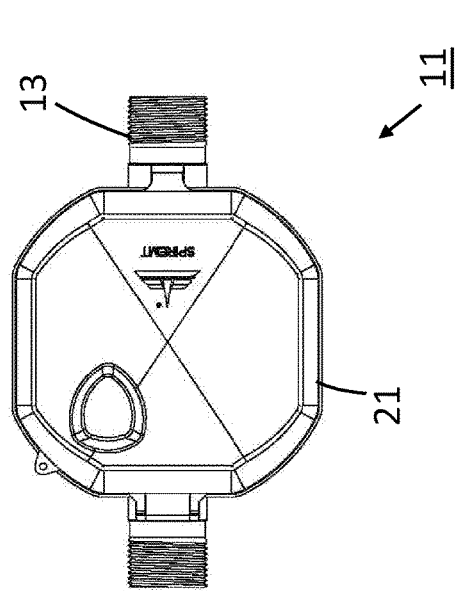
Figure 1C:
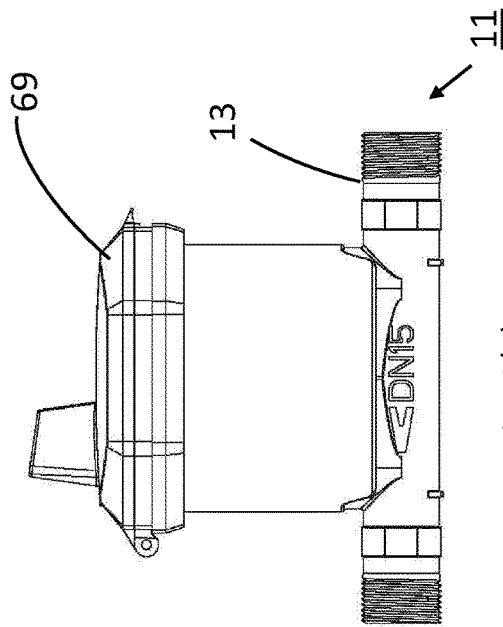

Referring now to FIGS. 1(a)-(d), there is shown a flow meter constructed according to the teachings of the present invention, the flow meter being identified generally by reference numeral 11. As will be explained further below, flow meter 11 is uniquely constructed so as to provide an enhanced level of waterproof protection to sensitive electrical components retained therein while, at the same time, facilitating power supply replacement.

In the description that follows, flow meter 11 is described primarily in connection with the measurement of the flow rate and/or volume of water delivered therethrough. However, it is to be understood that flow meter 11 is not limited for use with water, but rather could be utilized with other types of fluids without departing from the spirit of the present invention.

Figure 2:
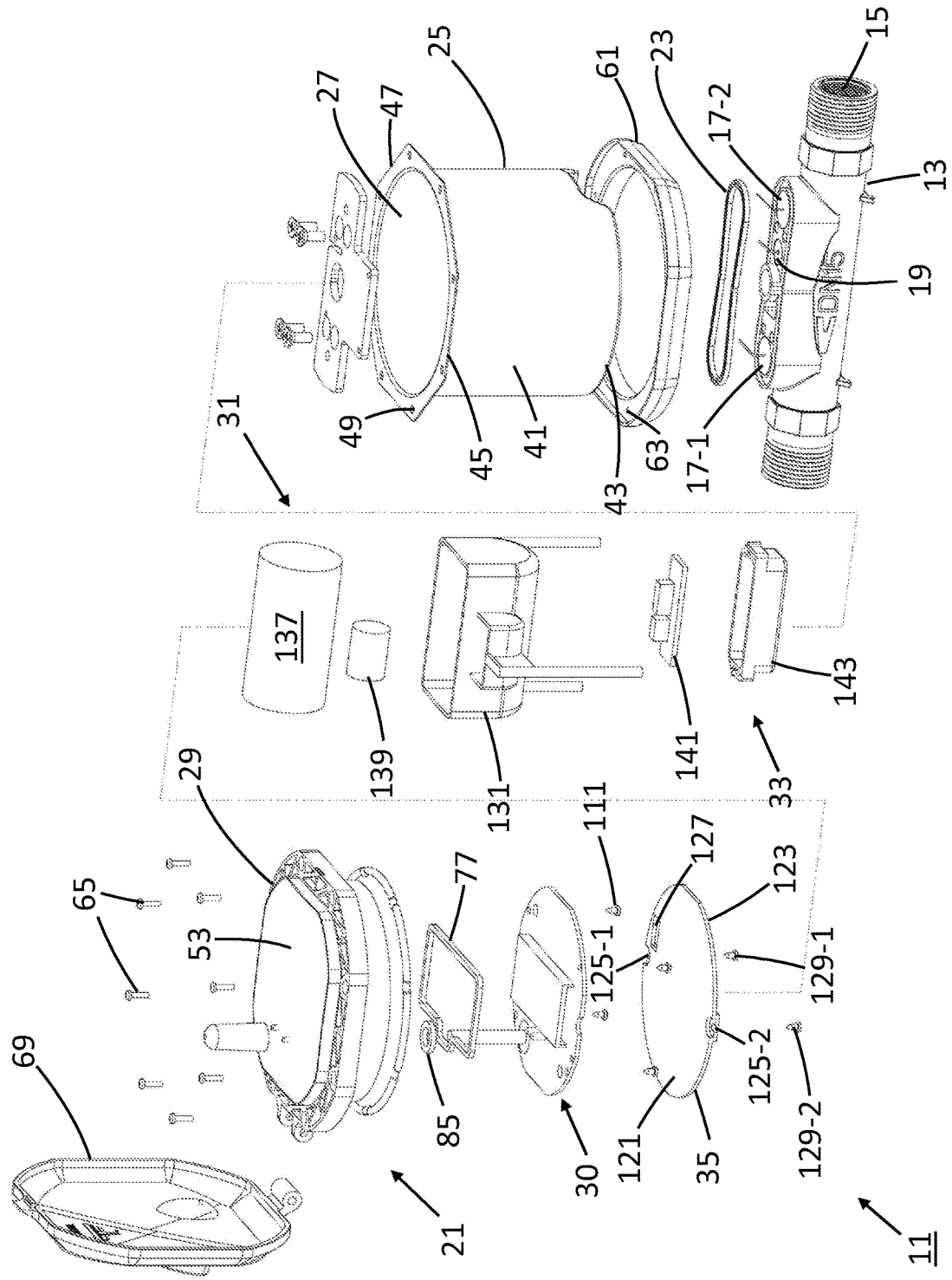
FIG. 2 is an exploded, front perspective view of the flow meter shown in FIG. 1(a)

Referring now to FIG. 2, flow meter 11 comprises (i) a unitary flow tube, or cell, 13 shaped to define a substantially enclosed, internal passageway 15 through which water travels, (ii) a pair of ultrasonic transducers 17-1 and 17-2 which are independently mounted within flow tube 13 in fluid communication with internal passageway 15, (iii) a temperature sensor 19 mounted within flow tube 13 for measuring the temperature therewithin, and (iv) a core, or integrator, module 21 mounted on flow tube 13 through a watertight seal achieved via gasket 23.

Core module 21 is in electrical communication with transducers 17 and temperature sensor 19. In use, core module 21 compiles and processes data from transducers 17 and temperature sensor 19 in order to calculate fluid flow rate and/or volume. Although a single pair of transducers 17 and a single sensor 19 are represented herein, different arrangements of transducers 17 and sensors 19 could be similarly integrated into flow meter 11 without departing from the spirit of the present invention. As will be explained further in detail below, the specific assembly of core module 21 serves as the principal novel feature of the present invention.

Core Module 21

As referenced briefly above, core module 21 is uniquely constructed so as to provide an enhanced level of waterproof protection to sensitive electrical components retained therein. In particular, core module 21 is designed to separate its various electrical components into two distinct compartments in order to promote and enhance waterproof protection as well as facilitate power supply replacement.

Figure 3B:
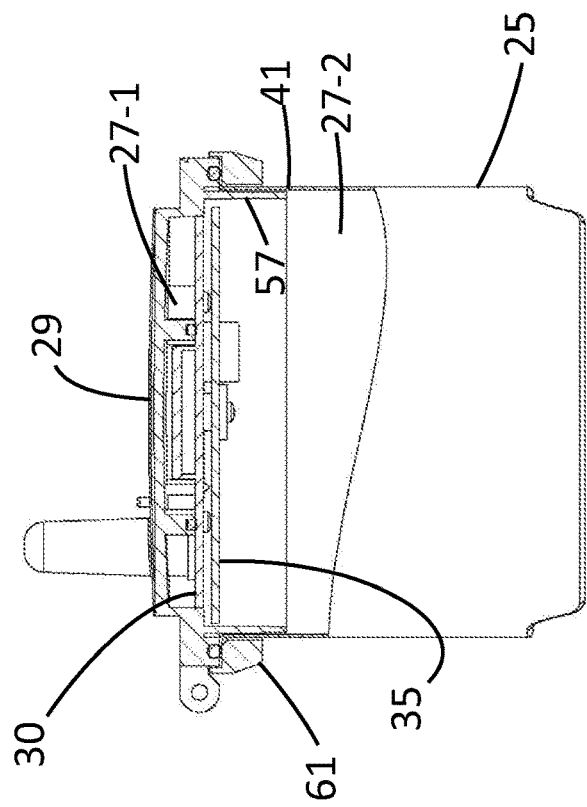
FIG. 3(b) is a partial section of the core module shown in FIG. 3(a), taken along lines 3b-3b.
Figure 3A:
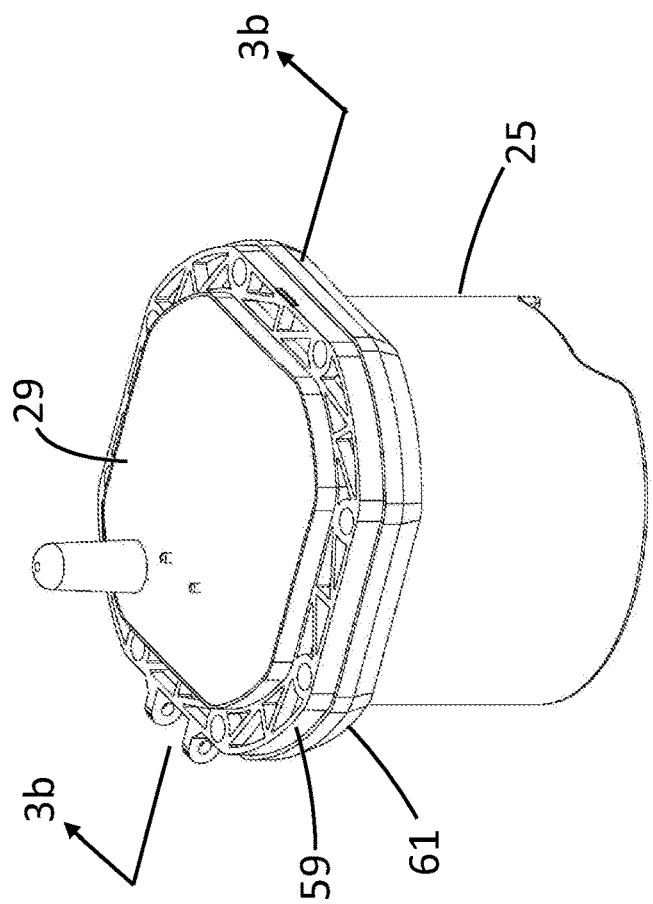
FIG. 3(a) is a front perspective view of the core module shown in FIG. 1(a), the core module being shown with the top lid removed therefrom.

Referring now to FIGS. 2, 3(a), and 3(b), core, or integrator, module 21 comprises (i) an enlarged, cup-shaped enclosure, or housing, 25 shaped to define an interior cavity 27, (ii) a top cover 29 mounted on enclosure 25 for substantially enclosing interior cavity 27, (iii) a printed circuit board (PCB) assembly 30 located within interior cavity 27 for, inter alia, processing signal data to yield flow measurement results and, in turn, wirelessly transmitting and/or visually displaying the results, (iv) a power supply assembly 31 located within interior cavity 27 for powering the various electrical components, (v) a connector assembly 33 located within interior cavity 27 for facilitating connection between the various electrical components, and (vi) a partition, or holder, 35 mounted within enclosure 25 for separating interior cavity 27 into an upper compartment 27-1, which is designated for PCB assembly 30, and a lower compartment 27-2, which is designated for power supply assembly 31 and connector assembly 33. By separating interior cavity 27 into separate compartments 27-1 and 27-2, different potting techniques can be utilized for the various electrical components, which is desirable since certain electrical components are prone to replacement (e.g. power supply assembly 31) and other electrical components are more permanent in nature (e.g. PCB assembly 30).

As seen most clearly in FIG. 2, enclosure 25 is a cylindrical cup-shaped housing with a continuous sidewall 41, a partially enclosed bottom end 43, and an open top end 45. An outward radial flange 47 is formed on open top end 45 and includes a plurality of mounting holes 49, the function of which will become apparent below.

As seen most clearly in FIGS. 4(a)-(e), top cover 29 is a unitary component which includes (i) a planar top wall 51 having a top surface 53 and a bottom surface 55, (ii) a cylindrical collar 57 projecting orthogonally out from bottom surface 55, and (iii) an outward radial flange 59 with a plurality of thru-holes 61 that generally align with mounting holes 49 in enclosure 25.

As seen most clearly in FIGS. 3(a) and 3(b), top cover 29 is designed to mount onto open top end 45 of enclosure 25 such that collar 57 aligns directly inside of continuous sidewall 41 and top wall 51 is disposed on flange 47 so as to enclose interior cavity 27. An annular fixture 61 with a plurality of self-tapping holes 63 is designed to be disposed onto the underside of flange 47. A set of screws 65 is then inserted through thru-holes 61 in top cover 29, holes 49 in enclosure 25, and into self-tapping engagement with holes 63 in fixture 61. In this manner, screws 65 serve to secure top cover 29 and fixture 61 on opposite sides of flange 47.

As a feature of the present invention, fixture 61 is preferably provided with multiple sets of self-tapping holes 63. In this manner, screws 65 can be removed to allow for access into interior cavity 27 (e.g., to replace power supply assembly 31) and then reinserted through a secondary set of holes 63 in fixture 61 in order to remount top cover 29 onto housing 25.

In lieu of multiple sets of self-tapping holes 63, it is to be understood that a single set of holes 63 could be utilized and, in turn, fitted with removable, internally-threaded, metal inserts (not shown). In this manner, the metal inserts could be removed and replaced from the same set of holes 63 in fixture 61, as needed, to allow for repeated assembly and disassembly of core module 21.

As seen most clearly in FIGS. 1(a)-(d) and 2, a top protective lid 69 is pivotally coupled to top cover 29. Top lid 69 is preferably constructed of a rigid and durable material and is designed to selectively cover, and thereby protect, top surface 53 of top cover 29 when visible access to measurement results displayed by PCB assembly 30 is not required.

Figure 4B:
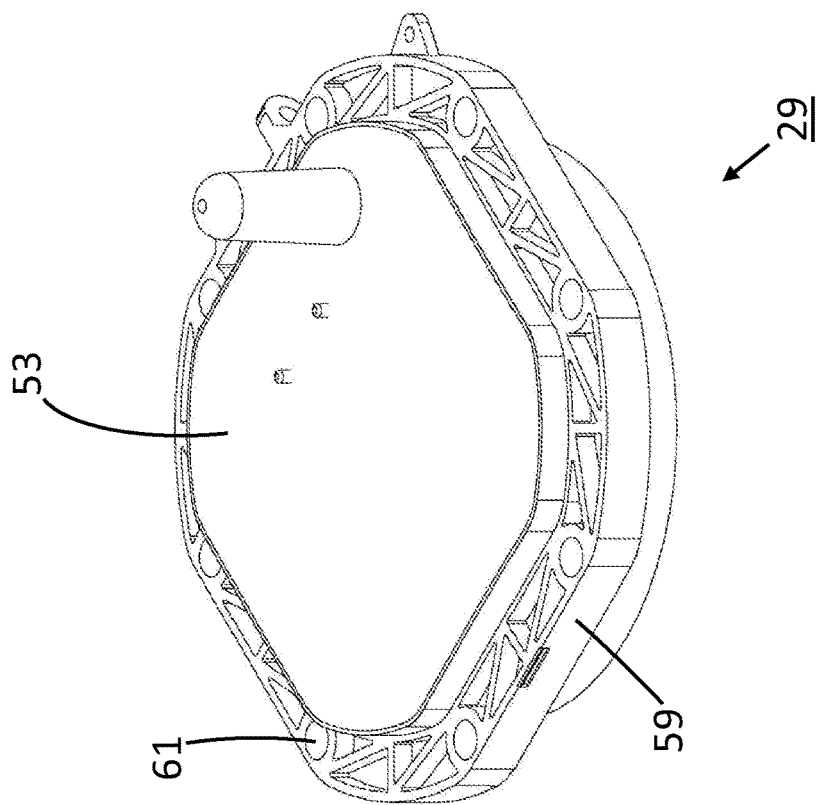
Figure 4A:
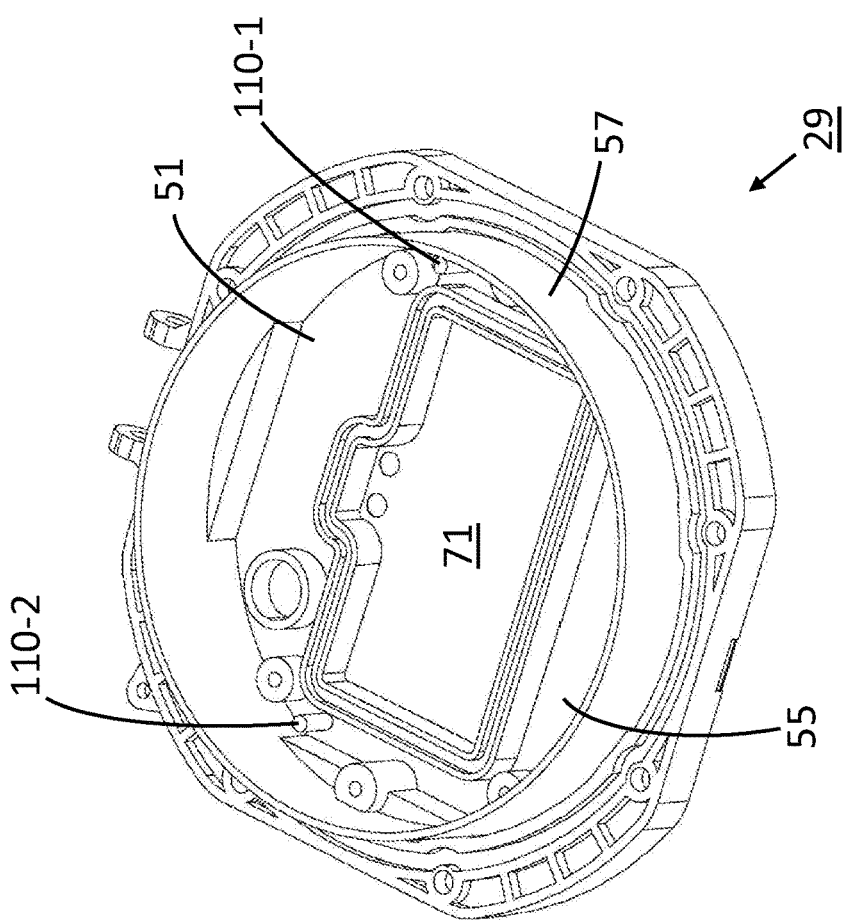
Figure 5A:
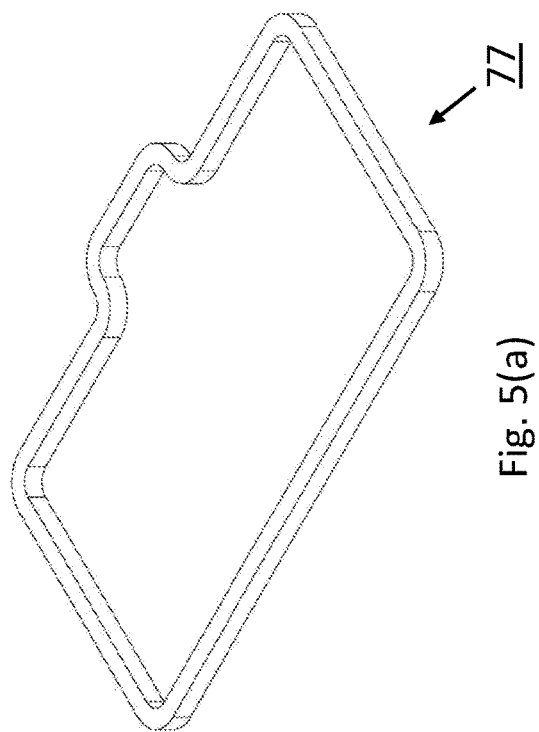
FIGS. 5(a)-(c) are top perspective, top, and front views, respectively, of the gasket shown in FIG. 2.
Figure 5B:
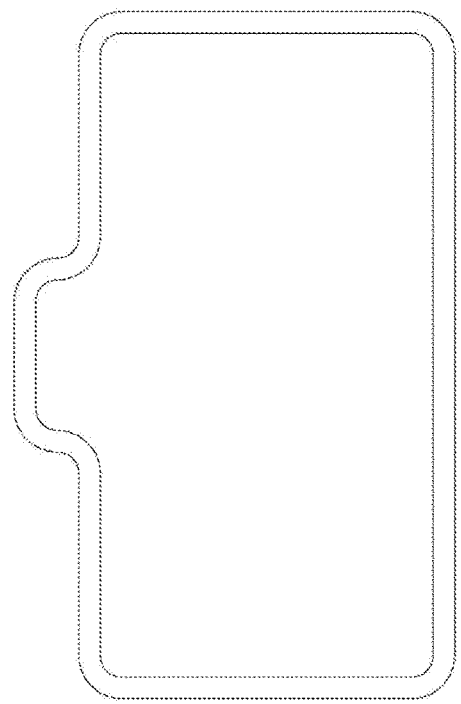
Figure 5C:
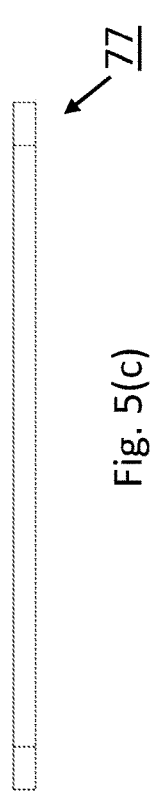

Referring back to FIGS. 4(a)-(e), bottom surface 55 of top wall 51 is provided with means for effectively sealing water-sensitive components. Specifically, bottom surface 55 includes a generally rectangular display window, or region, 71, which is dimensioned to receive certain display components of PCB assembly 30 and thereby enable external viewing. As a feature of the invention, a pair of spaced apart sidewalls 73-1 and 73-2 project up from bottom surface 55 of top wall 51 immediately around the periphery of window 71 and together define a narrow seal groove 75 therebetween. Accordingly, a watertight seal 77, shown in isolation in FIGS. 5(a)-(c), is dimensioned to be fittingly inserted into groove 75 and thereby protect the display components of PCB assembly 30 from moisture without the need of potting material, which is a principal object of the present invention. Also, watertight seal 77 serves as a barrier that prevents the deposition of potting material into display window 71, as potting material would otherwise contaminate visibility and/or operability of certain display components of PCB assembly 30.

Additionally, bottom surface 55 of top wall 51 is provided with a circular sidewall 81 in communication with a hollow conical projection 83 which projects orthogonally out from top surface 53. An annular seal 85 fittingly surrounds sidewall 81 and thereby protects components of PCB assembly 30 from moisture without the need of potting material. Also, seal 85 serves as a barrier that prevents the deposition of potting material around certain antenna components of PCB assembly 30 which may weaken signal transmission, as will be explained further below.

More specifically, referring now to FIGS. 6(a)-(d), the details of PCB assembly 30 are shown. As can be seen, PCB assembly 30 comprises a disc-shaped printed circuit board (PCB) 91 having a planar top surface 93, a planar bottom surface 95, a set of mounting holes 97-1 thru 97-4, a set of clearance holes 99-1 and 99-2, and a pair of potting holes 101-1 and 101-2, the functions of each to be explained further below.

Additionally, PCB assembly 30 comprises (i) a rectangular digital display 103 mounted on top surface 93, (ii) a pair of light emitting diodes (LEDs) 105-1 and 105-2 mounted on top surface 93, (iii) an antenna 107 mounted on top surface 93, and (iv) an electrical connector 109 mounted on bottom surface 95. As a feature of the present invention, display 103 and LEDs 105 align within window 71 and are protected from moisture by seal 77 (i.e., without the need of potting material). Similarly, antenna 107 extends into conical projection 83 and is protected from moisture by annular seal 85 (i.e., without the need of potting material). As will be explained further below, seals 77 and 85 additionally serve as barriers that prevent the deposition of potting material into display window 71 and immediately surrounding antenna 107, respectively. As can be appreciated, limiting the deposition of potting material serves to not only minimize assembly costs but also restrict contamination, as it has been found that excessive deposition of potting material can both (i) compromise the visibility and/or operability of display 103 and LEDs 105 as well as (ii) weaken radio frequency signals transmitted to/from antenna 107.

Core Module 21 Assembly Process

Figure 7C:
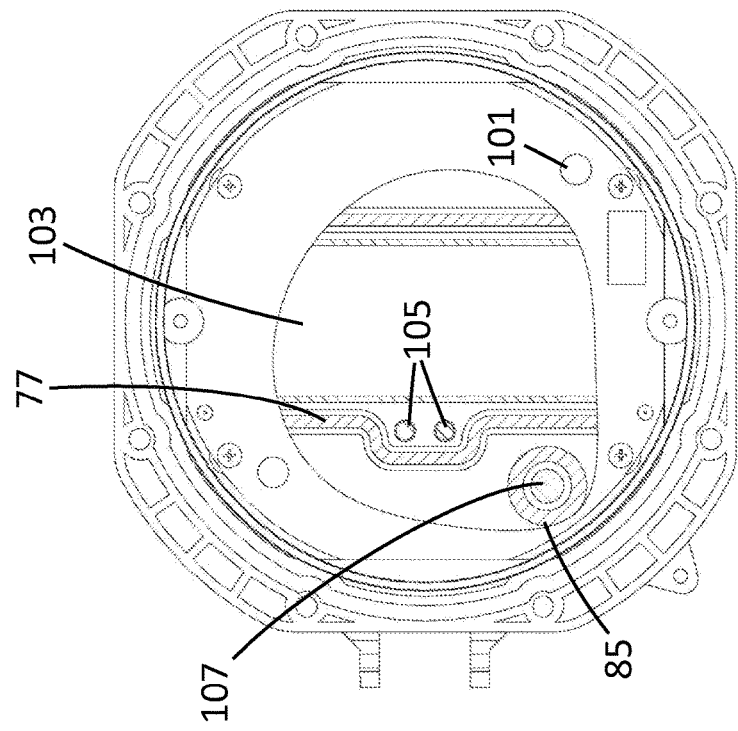
FIG. 7(c) is a bottom view of the top cover and printed circuit board assembly shown in FIG. 7(a), the printed circuit board being shown broken away in part, and the remainder of the printed circuit board assembly and top cover being shown in section to illustrate the watertight seal achieved by various sensitive electrical components.
Figure 7B:
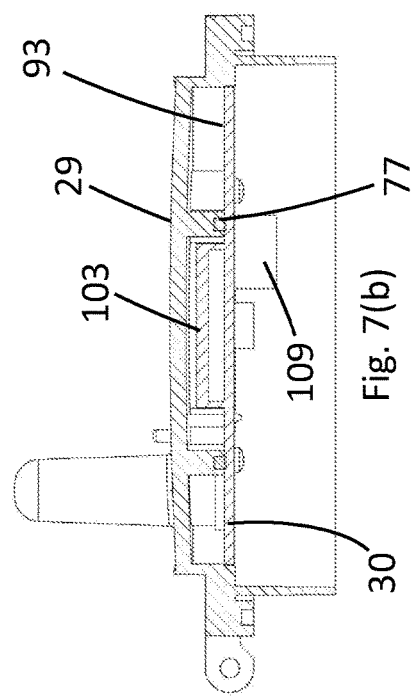
FIG. 7(b) is a section view of the top cover and printed circuit board assembly shown in FIG. 7(a), taken along lines 7b-7b.
Figure 7A:
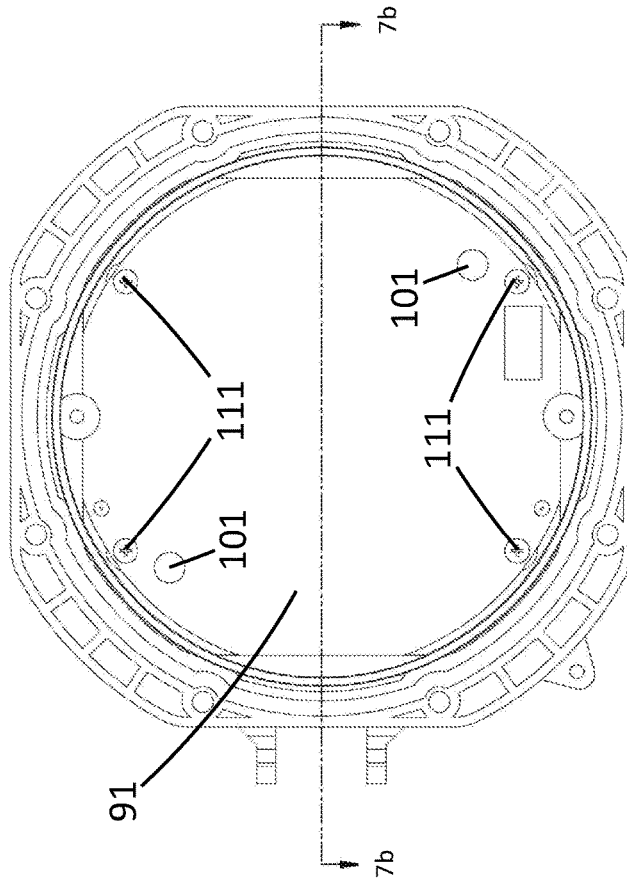
FIG. 7(a) is a bottom view of the top cover and printed circuit board assembly shown in FIG. 2.

Referring now to FIGS. 7(a)-(c), core module 21 is designed to be assembled in the following manner. Specifically, with rectangular seal 77 fittingly disposed within groove 75 and annular seal 85 surrounding sidewall 81, PCB assembly 30 is positioned against bottom surface 55 of top cover 29 such that display 103 and LEDs 105 align within window 71 and antenna 107 extends into conical projection 83. To facilitate alignment, a pair of post-like extrusions 110-1 and 110-2 formed in bottom surface 55 of top cover 29, which are shown in FIG. 4(a), fittingly project through clearance holes 99-1 and 99-2, respectively, in PCB 91. A set of PCB board screws 111 are driven through mounting holes 97 and, in turn, into complementary threaded bores 113 in bottom surface 55 to secure PCB assembly 30 onto top cover 29.

Thereafter, potting material (not shown) is inserted between PCB assembly 30 and top cover 29 through potting holes 101 in order to protect any exposed sensitive circuitry on top surface 93 of PCB 91. As referenced previously, the inclusion of sealants 77 and 85 minimizes the reliance upon potting material to protect display 103, LEDs 105 and antenna 107. In fact, seals 77 and 85 serve as barriers that prevent the deposition of potting material into display window 71 and immediately surrounding antenna 107, respectively. Because the applicant has recognized the inherent unreliability and potentially obscuring effects of potting material, the use of physical sealants 77 and 85 provides module 21 with more effective waterproofing, which is a principal object of the present invention.

Potting material (not shown) is also generously applied onto bottom surface 95 of PCB 91 without encapsulating connector 109 (i.e., to protect electrical circuitry on bottom surface 95 from moisture). After completion of the application of potting material in the manner set forth above, partition 35 is mounted onto top cover 29 over PCB assembly 30. As seen most clearly in FIG. 2, partition 35 is a unitary disc-shaped member which includes a planar top surface 121, planar bottom surface 123, a pair of countersunk holes 125-1 and 125-2 and a rectangular connector cutout 127.

Figure 8C:
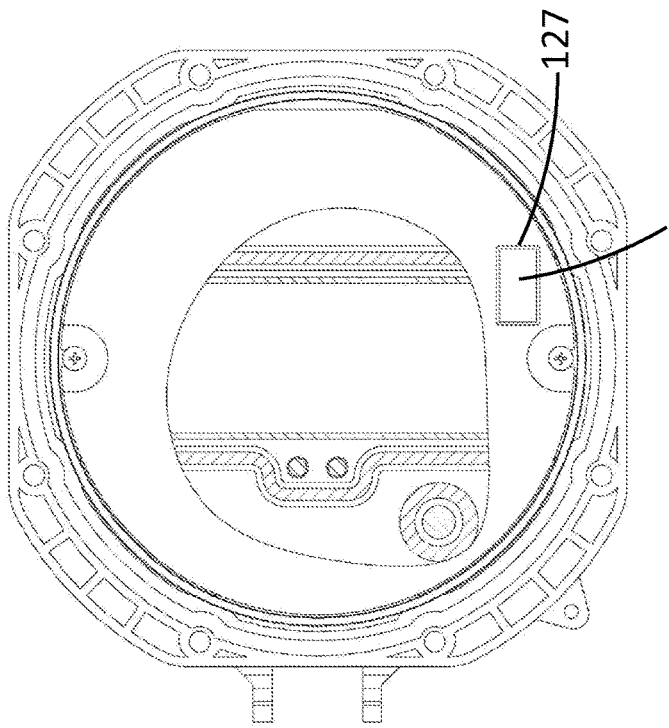
FIG. 8(c) is a bottom view of the top cover, printed circuit board assembly, and enclosure partition shown in FIG. 8(a), the enclosure partition and printed circuit board assembly being shown broken away in part, and the remainder of the printed circuit board assembly and top cover being shown in section to illustrate the watertight seal of sensitive electrical components.
Figure 8B:
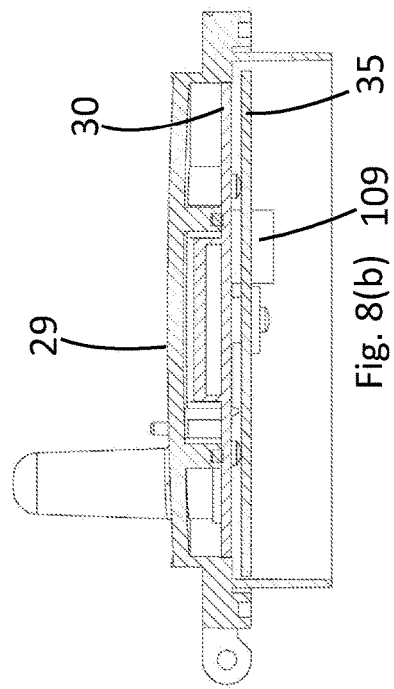
FIG. 8(b) is a section view of the top cover, printed circuit board assembly, and enclosure partition shown in FIG. 8(a), taken along lines 8b-8b.
Figure 8A:
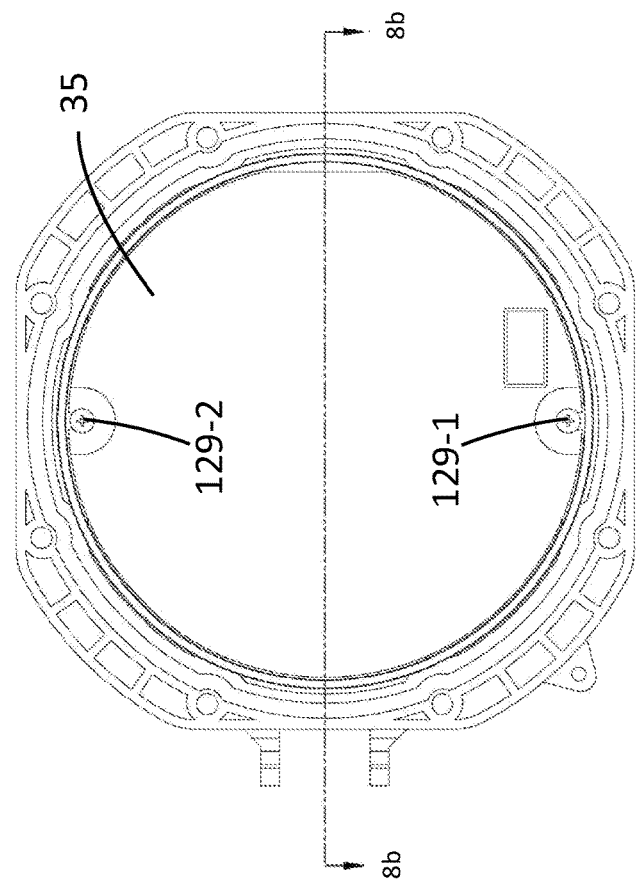
FIG. 8(a) is a bottom view of the top cover, printed circuit board assembly, and enclosure partition shown in FIG. 2.

As seen most clearly in FIGS. 8(a)-(c), partition 35 mounts onto top cover 29 directly over PCB assembly 30 such that connector 109 fittingly projects through cutout 127. A pair of mounting screws 129-1 and 129-2 is disposed through holes 125-1 and 125-2, respectively, in partition 35, through arcuate lateral notches 112-1 and 112-2, respectively, in PCB assembly 30 and into complementary threaded bores 131-1 and 131-2, respectively, in bottom surface 55 of top cover 29.

In this manner, partition 35 serves as a rigid and durable physical barrier that protects PCB assembly 30 from moisture and/or other harmful elements. Partition 35 additionally serves to separate interior cavity 27 into (i) a compact upper compartment 27-1, which is dimensioned to receive water-sensitive PCB assembly 30, (ii) an enlarged lower compartment 27-2, which receives power supply assembly 31 and connector assembly 33, both of the aforementioned components often requiring access during the life of flow meter 11. In other words, because partition 35 separates interior cavity 27 into upper and lower compartments 27-1 and 27-2, access to power supply assembly 31 and connector assembly 33 can be easily achieved without compromising the watertight seal applied to the sensitive electrical components on PCB assembly 30.

Figure 9:
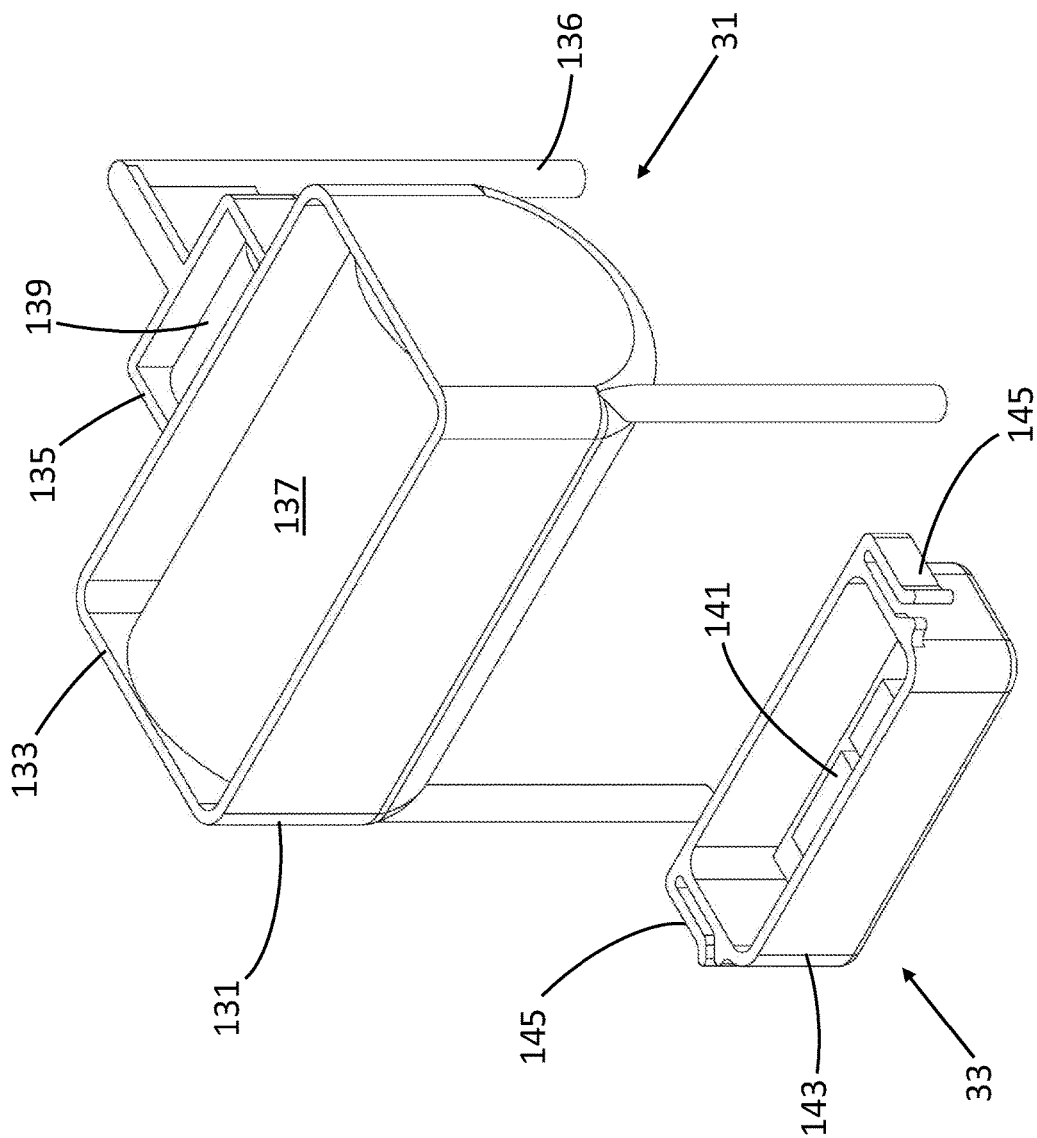
FIG. 9 is a rear perspective view of the battery assembly and the connector assembly shown in FIG. 2.

As seen most clearly in FIG. 9, power supply assembly 31 comprises a unitary, rigid holder 131 which comprises a five-sided, or trough-like, battery receptacle 133, a five-sided, or trough-like, supercapacitor receptacle 135, and a plurality of legs 136 which project downward from receptacles 133 and 135 in order to stand, or mount, holder 131 on a flat surface.

As can be appreciated, battery receptacle 133 is dimensioned to fittingly receive a battery 137 and supercapacitor receptacle 135 is dimensioned to fittingly receive a supercapacitor 139. Together, battery 137 and supercapacitor 139 provide the necessary power for flow meter 11, but it is to be understood that the particular types and arrangement of power sources could be modified without departing from the spirit of the present invention.

With electrical wiring (not shown) extending out from battery 137 and supercapacitor 139, potting material (not shown) is filled into the voids within receptacles 133 and 135 in order to encapsulate battery 137 and supercapacitor 139 within a waterproofed enclosure. In fact, it is envisioned that replacement of power supply assembly 31 could be most efficiently achieved through the entire replacement of holder 131, battery 137, supercapacitor 139 and all potting material used to waterproof the electrical devices. By simply disconnecting power supply assembly 31 and replacing the unit with a similarly constructed assembly 31, power replacement can be achieved without requiring the removal and replacement of potting material, which is highly desirable.

Connector assembly 33 comprises a connector PCB 141 and a unitary, trough-like holder 143 dimensioned to receive connector PCB 141. As can be appreciated, connector PCB 141 facilitates electrical connection between PCB assembly 30, power supply assembly 31, transducers 17 and sensor 19. Preferably, holder 143 is filled with a potting material to encapsulate sensitive components on connector PCB 141. Additionally, holder 143 is provided with a pair of resilient clips 145 for retaining electrical wiring utilized in the aforementioned connections.

Referring back to FIG. 2, with partition 35 mounted on top cover 29, power supply assembly 31 and connector assembly 33 are deposited within lower compartment 27-2. Because power supply assembly 31 and connector assembly 33 are individually encapsulated with potting material, the remainder of lower compartment 27-2 can remain open (i.e., in the absence of potting material), thereby simplifying the manufacturing process.

The invention described in detail above is intended to be merely exemplary and those skilled in the art shall be able to make numerous variations and modifications to it without departing from the spirit of the present invention. All such variations and modifications are intended to be within the scope of the present invention as defined in the appended claims.

Principal Features and Advantages of the Present Invention

As referenced above, flow meter 11 is designed with a number of notable features which provide significant performance advantages over traditional flow meters.

As a first advantage, the separation of the PCB assembly 30 and power supply assembly 31 into separate compartments within cup-shaped enclosure 27 allows for different waterproofing techniques to be utilized based on the frequency of access required during the life of flow meter 11.

As a second advantage, more rigid physical structures are utilized in the construction of core module 21 in combination with and/or in place of potting material to create a more watertight construction. Notably, partition 35, seal 77, and seal 85 are utilized to protect components of PCB assembly 30 from moisture in lieu of potting material, which is more susceptible to deformation and/or wearing away over time. Additionally, seals 77 and 85 prevent sensitive electrical components from being obscured or otherwise adversely affected by the excessive deposition of potting material.

As a third advantage, the individually encapsulated and self-contained nature of power supply assembly 31 allows for increased ease of removal and replacement, as needed, over the lifespan of flow meter 11.

As a fourth advantage, the individualized waterproofing of the various electrical components within core module 21 allows for significant empty space to remain within interior cavity 27 and thereby eliminate the need for potting material to be filled therein. As a result, the process for assembling core module 21 is greatly simplified.

What is claimed is:

1. A flow meter, comprising:
   (a) a flow tube shaped to define an internal passageway;
   (b) a set of transducers coupled to the flow tube in fluid communication with the internal passageway; and
   (c) a core module coupled to the flow tube, the core module comprising,
      (i) an enclosure shaped to define an interior cavity, wherein the enclosure is a cylindrical housing with a continuous sidewall, a partially enclosed bottom end, and an open top end,
      (ii) a partition mounted within the interior cavity of the enclosure, the partition separating the interior cavity into an upper compartment and a lower compartment,
      (iii) a printed circuit board (PCB) assembly in electrical communication with the set of transducers, the PCB assembly being mounted in the enclosure within the upper compartment of the interior cavity, the PCB assembly comprising,
         (A) a printed circuit board having a top surface, a bottom surface and at least one transverse potting hole,
         (B) a digital display mounted on the top surface of the printed circuit board,
         (C) an antenna mounted on the top surface of the printed circuit board, and
         (D) an electrical connector mounted on the bottom surface of the printed circuit board,
      (iv) a power supply assembly in electrical communication with the PCB assembly and the set of transducers, the power supply assembly being mounted in the enclosure within the lower compartment of the interior cavity,
      (v) a top cover mounted on the open top end of the enclosure, the top cover comprising,
         (A) a planar top wall having a top surface and a bottom surface, the planar top wall comprising,
            (I) a display window,
            (II) a pair of spaced apart sidewalls projecting out from the bottom surface immediately around the periphery of the display window, the pair of sidewalls defining a narrow groove therebetween,
            (III) a hollow conical projection extending orthogonally out from the top surface,
            (IV) wherein the PCB assembly is secured to the bottom surface of the top wall of the top cover such that the digital display directly aligns within the display window and the antenna protrudes into the conical projection,
            (V) wherein the partition is mounted onto the top cover over the PCB assembly,
         (B) a cylindrical collar projecting orthogonally out from the bottom surface of the planar top wall, and
         (C) a flange projecting radially outward from the planar top wall, the flange being shaped to define a plurality of thru-holes, and
      (vi) first and second seals, the first seal being inserted within the narrow groove in the top wall of the top cover to create a watertight seal between the top cover and the PCB assembly around the digital display, the second seal being disposed around the antenna to create a watertight seal between the top cover and the PCB assembly around the antenna.

2. The flow meter of claim 1 wherein the partition is shaped to define a cutout through which the electrical connector on the printed circuit board fittingly projects with the partition mounted onto the top cover.

3. The flow meter of claim 2 wherein the core module further comprises an annular fixture with a plurality of self-tapping holes, at least a portion of the enclosure being disposed between the flange of the top cover and the annular fixture.

4. The flow meter of claim 3 wherein the flange and the annular fixture are secured together on opposite sides of the enclosure with a set of screws driven through a selection of the thru-holes in the flange and a selection of the self-tapping holes in the annular fixture.

5. A flow meter, comprising:
   (a) a flow tube shaped to define an internal passageway;
   (b) a set of transducers coupled to the flow tube in fluid communication with the internal passageway; and
   (c) a core module coupled to the flow tube, the core module comprising,
      (i) an enclosure shaped to define an interior cavity, wherein the enclosure is a cylindrical housing with a continuous sidewall, a partially enclosed bottom end, and an open top end,
      (ii) a partition mounted within the interior cavity of the enclosure, the partition separating the interior cavity into an upper compartment and a lower compartment,
      (iii) a printed circuit board (PCB) assembly in electrical communication with the set of transducers, the PCB assembly being mounted in the enclosure within the upper compartment of the interior cavity,
      (iv) a power supply assembly in electrical communication with the PCB assembly and the set of transducers, the power supply assembly being mounted in the enclosure within the lower compartment of the interior cavity,
      (v) a top cover mounted on the open top end of the enclosure, and
      (vi) a connector assembly in electrical communication with the PCB assembly, the power supply assembly, and the set of transducers, the connector assembly being mounted in the enclosure within the lower compartment of the interior cavity.

6. The flow meter of claim 5 wherein the power supply assembly comprises:
   (a) a holder comprising a battery receptacle from which protrudes a plurality of legs that are mounted on the bottom end of the enclosure; and
   (b) a battery dimensioned for placement within the battery receptacle.

7. The flow meter of claim 6 further comprising a temperature sensor coupled to the flow tube, the temperature sensor being in fluid communication with the internal passageway and in electrical communication with the core module.

8. The flow meter of claim 7 further comprising a gasket for creating a watertight seal between the core module and the flow tube.

* * * * *

UNITED STATES PATENT AND TRADEMARK OFFICE
CERTIFICATE OF CORRECTION

| | | |
|---|---|---|
| PATENT NO. | : 11,815,382 B2 | Page 1 of 1 |
| APPLICATION NO. | : 17/146876 | |
| DATED | : November 14, 2023 | |
| INVENTOR(S) | : Tianshui Liu et al. | |

It is certified that error appears in the above-identified patent and that said Letters Patent is hereby corrected as shown below:

On the Title Page

Inventors item (72), Line 3, please delete "Murad" and insert --Mourad--

Signed and Sealed this
Fourteenth Day of October, 2025

John A. Squires
*Director of the United States Patent and Trademark Office*